United States Patent
Katsumata

(10) Patent No.: US 11,058,016 B2
(45) Date of Patent: Jul. 6, 2021

(54) CONNECTOR AND CONNECTOR MANUFACTURING METHOD

(71) Applicant: YAZAKI CORPORATION, Tokyo (JP)

(72) Inventor: Kenichi Katsumata, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 16/824,627

(22) Filed: Mar. 19, 2020

(65) Prior Publication Data
US 2020/0315041 A1 Oct. 1, 2020

(30) Foreign Application Priority Data
Mar. 27, 2019 (JP) .............................. JP2019-060718

(51) Int. Cl.
*H05K 5/00* (2006.01)
*H01R 12/72* (2011.01)
*H05K 5/02* (2006.01)

(52) U.S. Cl.
CPC ......... *H05K 5/0069* (2013.01); *H01R 12/724* (2013.01); *H05K 5/0247* (2013.01); *H05K 2201/10189* (2013.01)

(58) Field of Classification Search
CPC ............... H05K 5/0069; H05K 5/0247; H05K 2201/10189; H01R 12/724; H01Q 1/22; H01Q 1/24; H01Q 1/32; B60R 11/02
USPC ........................................................ 439/78
See application file for complete search history.

(56) References Cited

U.S. PATENT DOCUMENTS

| 5,639,251 | A | * | 6/1997 | Harting | H01R 12/724 439/108 |
| 5,879,193 | A | * | 3/1999 | Thenaisie | H01R 23/6873 439/607.53 |
| 5,934,939 | A | * | 8/1999 | Thenaisie | H01R 13/627 439/607.53 |
| 7,104,811 | B2 | * | 9/2006 | Sakata | H01R 43/16 439/79 |

(Continued)

FOREIGN PATENT DOCUMENTS

| JP | 8-222924 A | 8/1996 |
| JP | 08222924 A * | 8/1996 |

(Continued)

*Primary Examiner* — Peter G Leigh
(74) *Attorney, Agent, or Firm* — Kenealy Vaidya LLP

(57) ABSTRACT

A connector is to be mounted on a printed circuit board connected to a mating connector. The connector includes a housing to be fixed to the printed circuit board, the housing including a plurality of terminal insertion holes extending parallel to the printed circuit board and a plurality of terminals, each of the plurality of terminals including a connection portion and a leg portion forming an L-shape, the connection portion being inserted into one of the terminal insertion holes toward the mating connector such that the connection portion is supported by the housing and such that the leg portion is electrically connectable to the printed circuit board. The plurality of terminals includes a first terminal to be connected to the mating connector, and a second terminal to serve as an antenna. The connection portion of the second terminal is shorter than the connection portion of the first terminal.

6 Claims, 10 Drawing Sheets

(56) References Cited

U.S. PATENT DOCUMENTS

| | | | | |
|---|---|---|---|---|
| 7,234,951 | B2* | 6/2007 | Wang | H01R 12/712 439/79 |
| 7,708,608 | B2* | 5/2010 | Soh | H01R 43/20 439/862 |
| 7,789,714 | B2* | 9/2010 | Liu | H01R 12/716 439/682 |
| 7,905,750 | B2* | 3/2011 | Mo | H01R 13/6658 439/541.5 |
| 8,079,854 | B2* | 12/2011 | He | H01R 13/6467 439/108 |
| 8,111,207 | B2* | 2/2012 | Liang | H01Q 9/40 343/906 |
| 8,330,655 | B2* | 12/2012 | Zadesky | H01R 13/665 343/702 |
| 8,376,785 | B2* | 2/2013 | Lapidot | H01R 13/6461 439/660 |
| 8,393,920 | B2* | 3/2013 | Yu | H01R 24/62 439/660 |
| 8,777,672 | B2* | 7/2014 | Chung | H01R 12/00 439/660 |
| 8,876,538 | B2* | 11/2014 | Shiraishi | H01R 13/516 439/79 |
| 9,466,884 | B2* | 10/2016 | Pu | H01Q 1/243 |
| 2005/0253726 | A1* | 11/2005 | Yoshida | H04B 5/02 340/572.8 |
| 2006/0049942 | A1* | 3/2006 | Sakama | G06K 19/07758 340/572.1 |
| 2006/0099836 | A1* | 5/2006 | Ho | H01R 12/725 439/74 |
| 2009/0042421 | A1* | 2/2009 | Zheng | H01R 12/712 439/83 |
| 2011/0306239 | A1* | 12/2011 | Zhang | H01R 24/62 439/607.01 |
| 2012/0009823 | A1* | 1/2012 | Lapidot | H01R 13/6461 439/626 |

FOREIGN PATENT DOCUMENTS

| | | | |
|---|---|---|---|
| JP | 2006302771 A | * | 11/2006 |
| JP | 2006304207 A | * | 11/2006 |
| JP | 2018-148448 A | | 9/2018 |

* cited by examiner

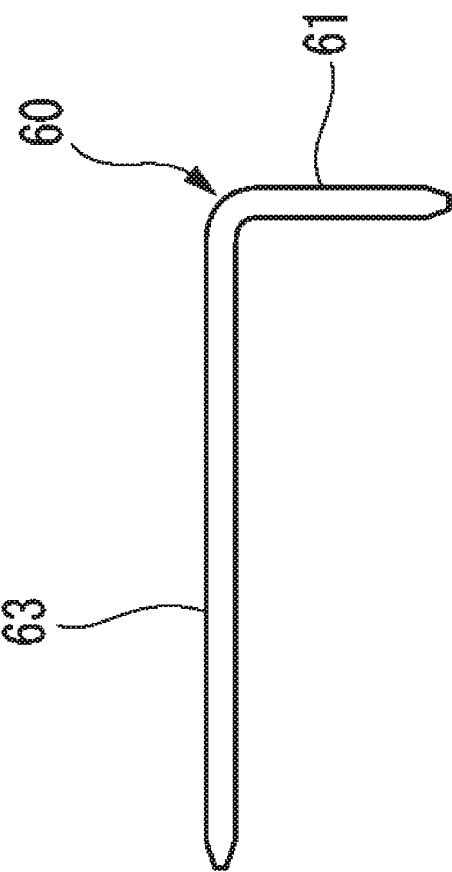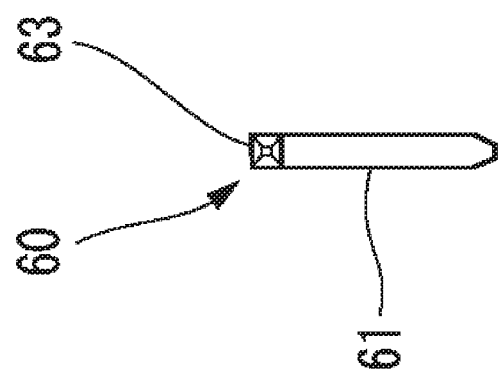

CONNECTOR AND CONNECTOR MANUFACTURING METHOD

CROSS-REFERENCE TO RELATED APPLICATION

The present application claims priority to Japanese Patent Application No. 2019-060718 filed on Mar. 27, 2019, the entire content of which is incorporated herein by reference.

TECHNICAL FIELD

The present invention relates to a connector and a connector manufacturing method.

BACKGROUND

In a related art electrical connection box with a wireless reception function, a metal antenna is fixed to a housing in a state of extending over an upper wall and a side wall of the housing of a connector mounted on a printed circuit board, thereby using the upper wall and the side wall of the housing of the connector as an antenna arrangement location (for example, see JP2018-148448A).

In an antenna structure according to another related art, one of connection terminals of a connector attached to a printed circuit board for power supply or the like is used as an free terminal, and a received signal is supplied to a receiver via a conductor pattern, an extension coil or the like by using the free terminal as an antenna (for example, see JPH8-222924A). By using the free terminal of the connector as an antenna, the number of components can be reduced. Thus the structure can be simplified and the assembling work can be improved as compared with a case where a dedicated antenna is separately provided.

The free terminal of the connector attached to the printed circuit board may be used as an antenna for transmission in this way. However, when a signal line is connected to one of the terminals of the connector and this terminal is used as it is as an antenna for transmission, an external electric wire may be connected directly to this terminal to increase the strength of the transmitted radio wave, which may result in the strength of the transmitted radio wave being increased to the extent that it is strong enough to violate laws and regulations regarding radio waves.

SUMMARY

Illustrative aspects of the present invention provide a connector with a simple structure that improves assembling work and a manufacturing method of the connector.

According to an illustrative aspect of the present invention, a connector is configured to be mounted on a printed circuit board and to be connected to a mating connector. The connector includes a housing configured to be fixed to the printed circuit board, the housing including a plurality of terminal insertion holes extending parallel to the printed circuit board and parallel to each other and a plurality of terminals, each of the plurality of terminals including a connection portion and a leg portion forming an L-shape together with the connection portion, the connection portion being inserted into one of the terminal insertion holes toward the mating connector such that the connection portion is supported by the housing and such that the leg portion is electrically connectable to the printed circuit board. The plurality of terminals includes a first terminal configured to be connected to the mating connector, and a second terminal configured to serve as an antenna. The connection portion of the second terminal is shorter than the connection portion of the first terminal.

According to another illustrative aspect of the present invention, a connector manufacturing method includes forming a plurality of terminals, each of the plurality of terminals comprising a connection portion and a leg portion by bending a rod element made of an electrically conductive metal material, inserting the connection portions of the plurality of terminals into terminal insertion holes of a housing toward a first direction, the terminal insertion holes being parallel to each other, with the leg portions extending in a second direction and cutting at least one of the connection portions of the terminals to shorten the at least one of the connection portions to form an antenna terminal.

Other aspects and advantages of the invention will be apparent from the following description, the drawings and the claims.

BRIEF DESCRIPTION OF THE DRAWINGS

FIGS. 3A and 3B are views showing a housing of the connector, in which FIG. 3A is a front view and FIG. 3B is a side view;

FIGS. 4A and 4B are views showing a power terminal, in which FIG. 4A is a front view and FIG. 4B is a side view;

FIGS. 5A and 5B are views showing an antenna terminal, in which FIG. 5A is a front view and FIG. 5B is a side view:

FIGS. 6A and 6B are views showing a signal terminal, in which FIG. 6A is a front view and FIG. 6B is a side view:

DETAILED DESCRIPTION

Hereinafter, exemplary embodiments of the present invention will be described in detail with reference to the drawings.

Figure 1:
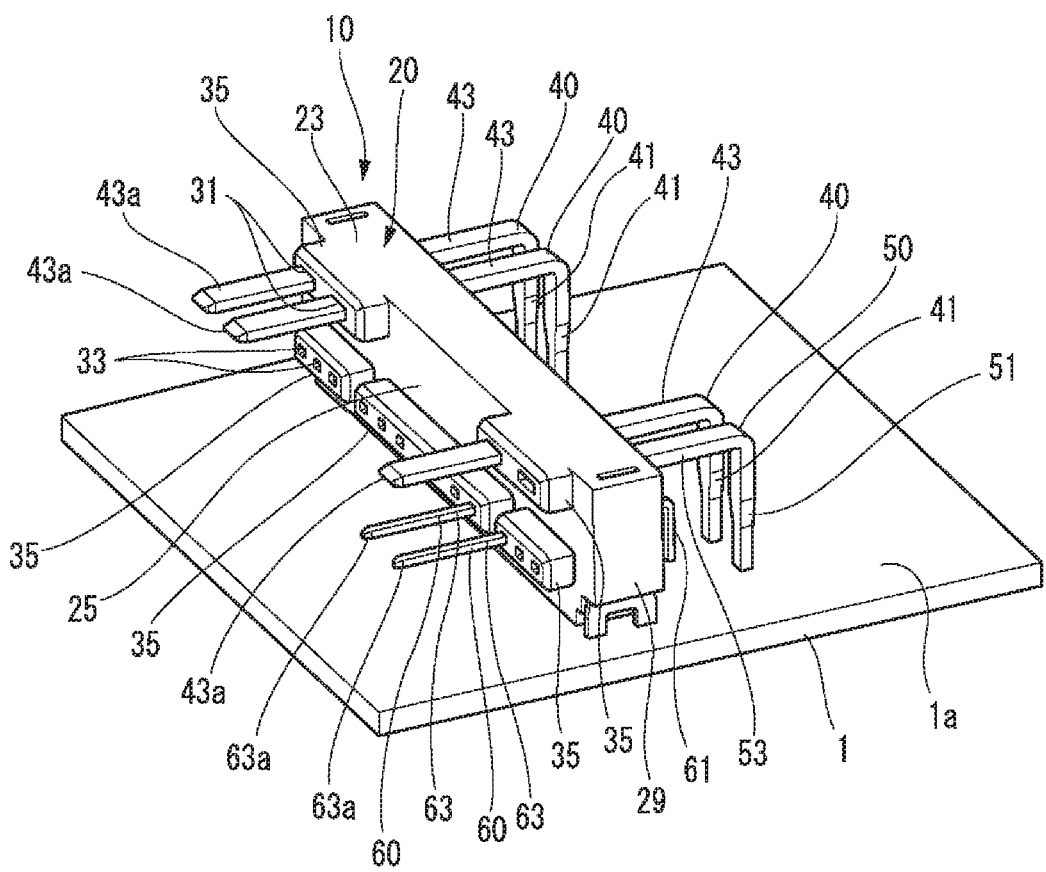
FIG. 1 is a perspective view of a connector according to the present embodiment mounted on a printed circuit board.
Figure 2:
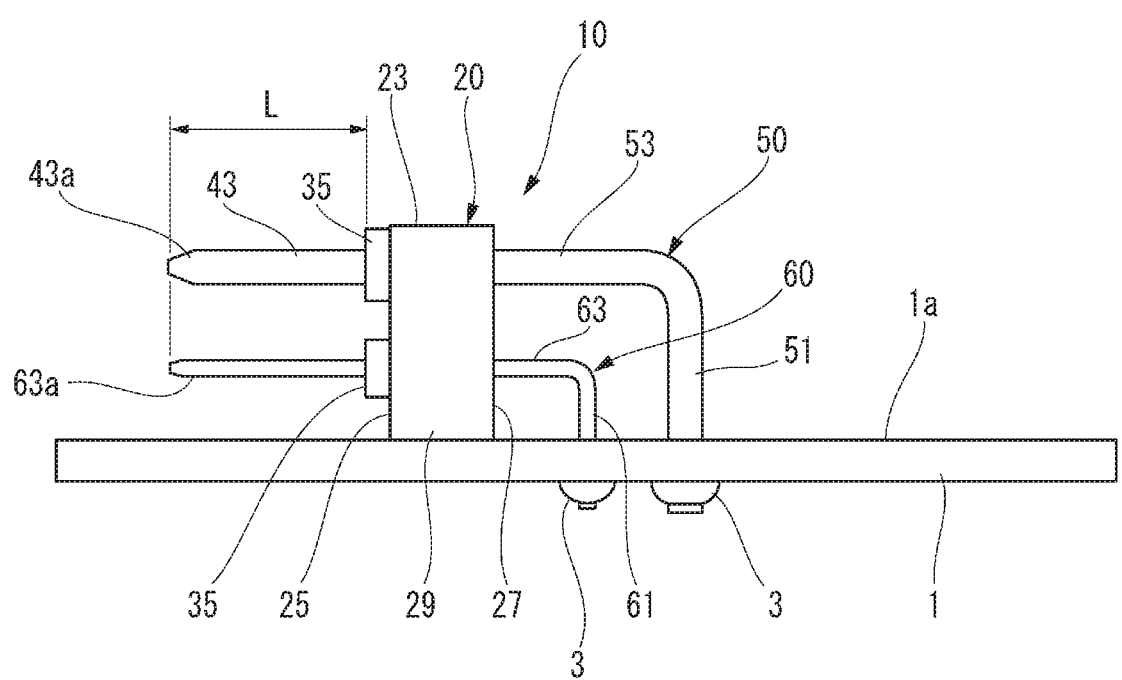
FIG. 2 is a side view of the connector according to the present embodiment mounted on the printed circuit board.

FIG. 1 is a perspective view of a connector according to the present embodiment mounted on a printed circuit board 1. FIG. 2 is a side view of the connector according to the present embodiment mounted on the printed circuit board 1.

As shown in FIGS. 1 and 2, a connector 10 according to the present embodiment includes a housing 20, power terminals 40, an antenna terminal 50 and signal terminals 60. The housing 20 is molded of an insulating synthetic resin. The power terminal 40, the antenna terminal 50 and the signal terminal 60 are formed of an electrically conductive metal material such as copper, copper alloy, aluminum or aluminum alloy.

The connector 10 is mounted on the printed circuit board 1 to form a communication device. The printed circuit board 1 has a conductor pattern (not shown). A transmission and reception circuit is formed by the conductor pattern. The communication device in which the connector 10 is mounted on the printed circuit board 1 transmits and receives radio waves to and from other devices based on various wireless communication standards such as Bluetooth (registered trademark) or Wi-Fi (registered trademark).

Figure 3B:
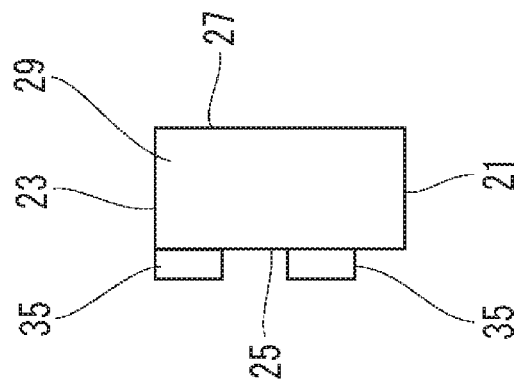
Figure 3A:
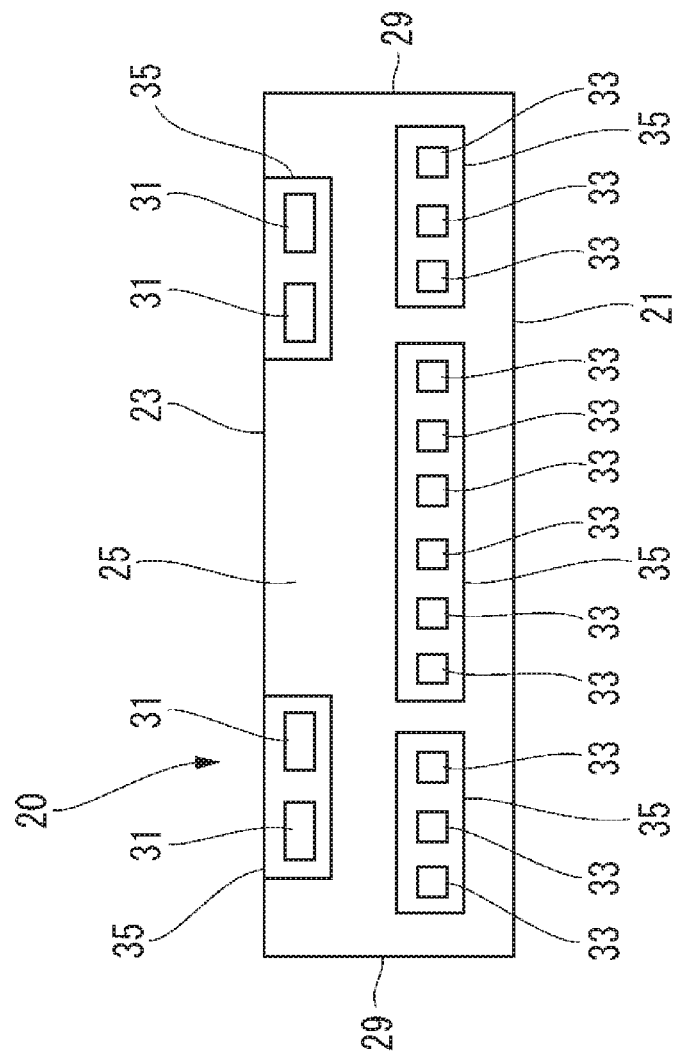

FIGS. 3A and 3B are views showing the housing 20 of the connector 10, in which FIG. 3A is a front view and FIG. 3B is a side view. As shown in FIGS. 3A and 3B, the housing 20 is formed in a rectangular parallelepiped shape having a bottom surface 21, an upper surface 23, a front surface 25, a rear surface 27 and both side surfaces 29. The bottom surface 21 of the housing 20 is fixed to the printed circuit board 1. The housing 20 has a plurality of power terminal insertion holes 31 and a plurality of signal terminal insertion holes 33. These power terminal insertion holes 31 and signal terminal insertion holes 33 are formed in parallel to each other so as to be parallel to the printed circuit board 1 when the housing 20 is fixed to the printed circuit board 1. These power terminal insertion holes 31 and signal terminal insertion holes 33 are holes that run through the housing 20 in a front-rear direction, in other words from the front surface 25 to the rear surface 27 of the housing 20. These power terminal insertion holes 31 and signal terminal insertion holes 33 are opened at the front surface 25 and at the rear surface 27. Terminal blocks 35 protruding forward are formed on the front surface 25 of the housing 20. The power terminal insertion holes 31 and the signal terminal insertion holes 33 are opened at the terminal blocks 35, respectively.

Figure 4B:
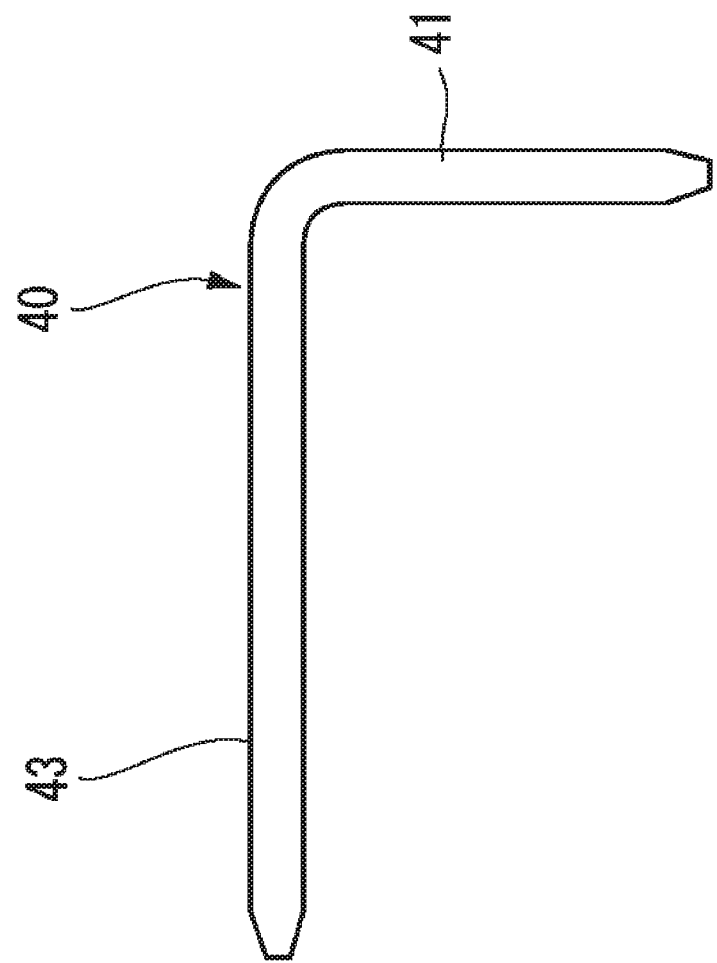
Figure 4A:
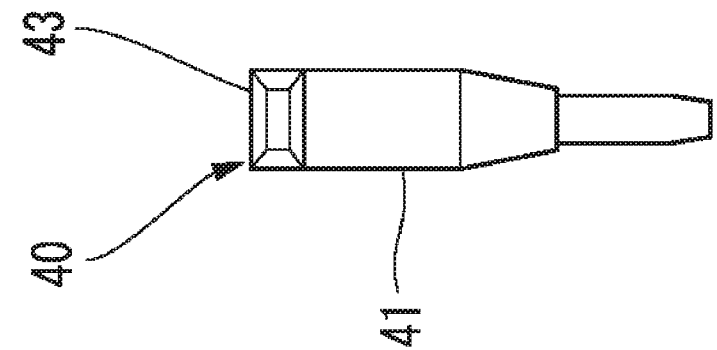

FIGS. 4A and 4B are views showing the power terminal 40, in which FIG. 4A is a front view and FIG. 4B is a side view. As shown in FIGS. 4A and 4B, the power terminal 40 is formed in a rod shape having a rectangular cross section. The power terminal 40 includes a leg portion 41 and a connection portion 43. The leg portion 41 is formed in a tapered shape that narrows toward a tip end thereof. The power terminal 40 is formed in an L-shape with the connection portion 43 being substantially orthogonal to the leg portion 41.

Figure 5B:
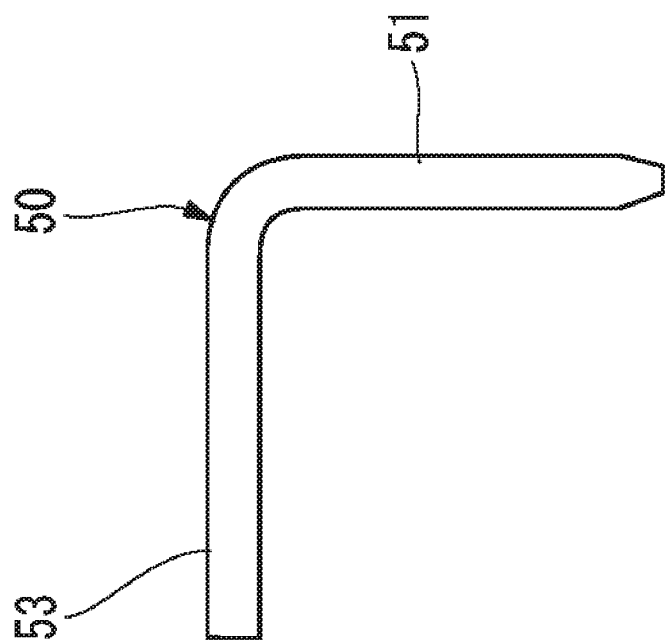
Figure 5A:
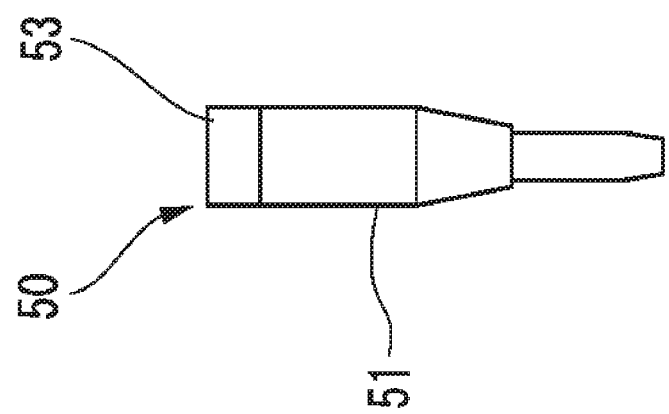

FIGS. 5A and 5B are views showing the antenna terminal 50, in which FIG. 5A is a front view and FIG. 5B is a side view. As shown in FIGS. 5A and 5B, the antenna terminal 50 includes a leg portion 51 and a connection portion 53. The leg portion 51 is formed in a tapered shape that narrows toward a tip end thereof. The antenna terminal 50 is formed in an L-shape with the connection portion 53 being substantially orthogonal to the leg portion 51. The antenna terminal 50 is obtained by cutting the connection portion 43 of the power terminal 40, and the connection portion 53 is a part of the connection portion 43.

FIGS. 6A and 6B are views showing the signal terminal 60, in which FIG. 6A is a front view and FIG. 6B is a side view. As shown in FIGS. 6A and 6B, the signal terminal 60 is formed in a rod shape having a rectangular cross section narrower than those of the power terminal 40 and the antenna terminal 50. The signal terminal 60 includes a leg portion 61 and a connection portion 63. The signal terminal 60 is formed in an L-shape with the connection portion 63 being substantially orthogonal to the leg portion 61.

As shown in FIGS. 1 and 2, the connection portion 43 of the power terminal 40 is inserted into the power terminal insertion hole 31 of the housing 20 with the leg portion 41 extending downward. The connection portion 43 of the power terminal 40 extends in an exposed manner from an end surface of the terminal block 35 on the front surface 25 of the housing 20 by a specified length L. In the power terminal 40, a portion of the connection portion 43 exposed from the terminal block 35 on the front surface 25 of the housing 20 serves as a connection end portion 43a.

The connection portion 53 of the antenna terminal 50 is inserted into one power terminal insertion hole 31 of the housing 20 with the leg portion 51 extending downward. An end portion of the connection portion 53 of the antenna terminal 50 is disposed at a position substantially the same as the end surface of the terminal block 35 on the front surface 25 of the housing 20. In other words, the end portion of the connection portion 53 does not extend beyond the end surface of the terminal block 35.

The connection portion 63 of the signal terminal 60 is inserted into the signal terminal insertion hole 33 of the housing 20 with the leg portion 61 extending downward. The connection portion 63 of the signal terminal 60 extends in an exposed manner from the end surface of the terminal block 35 on the front surface 25 of the housing 20 by the specified length L. In the signal terminal 60, a portion of the connection portion 63 exposed from the terminal block 35 on the front surface 25 of the housing 20 serves as a connection end portion 63a. The leg portion 61 of the signal terminal 60 is disposed closer to the housing 20 than the leg portion 41 of the power terminal 40 and the leg portion 51 of the antenna terminal 50.

Accordingly, the connector 10 in which the power terminal 40, the antenna terminal 50 and the signal terminal 60 are attached to the housing 20 is mounted on a mounting surface 1a of the printed circuit board 1. The housing 20 is to be fixed to the printed circuit board 1 by screws or the like, for example. The leg portions 41, 51, 61 of the power terminal 40, the antenna terminal 50 and the signal terminal 60 are to be inserted into through holes (not shown) formed in the printed circuit board 1, respectively. Each terminal is to be soldered to a land portion serving as a part of the conductor pattern by a solder 3. The power terminal 40, the antenna terminal 50 and the signal terminal 60 are to be conducted to a power line, an antenna line and a signal line of the conductor pattern of the printed circuit board 1, respectively, thereby forming the communication device.

In this communication device, a mating connector (not shown) is to be connected to a side of the front surface 25 of the housing 20 of the connector 10. The connection end portion 43a of the power terminal 40 and the connection end portion 63a of the signal terminal 60 are electrically connected to a power terminal and a signal terminal of the mating connector, thereby enabling power supply and signal transmission and reception. In addition, in the communication device, the antenna terminal 50 enables wireless communication by transmission and reception of radio waves to and from an external communication device.

In this way, according to the connector 10 having the above structure, one of a plurality of power terminals 40 attached by inserting the connection portion 43 into the power terminal insertion hole 31 of the housing 20 is used as the antenna terminal 50. The antenna terminal 50 includes the connection portion 53 having a short length. The antenna terminal 50 can be used as an antenna for wireless communication. Therefore, even though the connector 10 includes an antenna, the antenna terminal 50, with which wireless communication can be established, the structure of the connector 10 itself can be simplified and therefore the assembling work can be improved as compared with a case where a separately manufactured antenna is provided. Since a length of the connection portion 53 of the antenna terminal 50 is shorter than the connection portion 43 of other power terminals 40, it is possible to prevent a situation where one of the power terminals 40 having longer connection portions 43 is used as an antenna and an external electric wire is connected to this antenna, in which case the strength of the transmitted radio may exceed an upper limit prescribed by relevant laws and regulations. Accordingly, with the connector 10, the structure can be simplified and the assembling work can be improved while complying with the relevant laws and regulations.

Since the antenna terminal 50 differs from other power terminals 40 only in that no connection end portion 43a extending to a side at which the mating connector is to be connected to the connector 10 is provided, the antenna terminal 50 can easily be manufactured out of other power terminals 40. Thereby, the versatility can be improved and the manufacturing cost can be reduced. In addition, since no connection end portion 43a extending to the connection side with the mating connector is provided, a terminal of the mating connector can be prevented from being erroneously connected to the antenna terminal 50.

In addition, the connection portion 43 of any power terminal 40 including the antenna terminal 50 can be inserted into the power terminal insertion hole 31 of the housing 20. Therefore, the versatility of assembly can be improved by virtue of the common power terminal insertion holes 31.

Figure 7A:
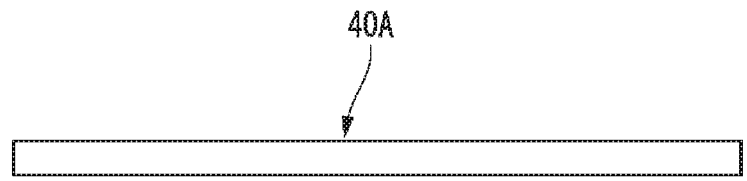
FIGS. 7A to 7C are views showing a manufacturing procedure of the power terminal and the antenna terminal, and are respectively side views during manufacturing.
Figure 7B:
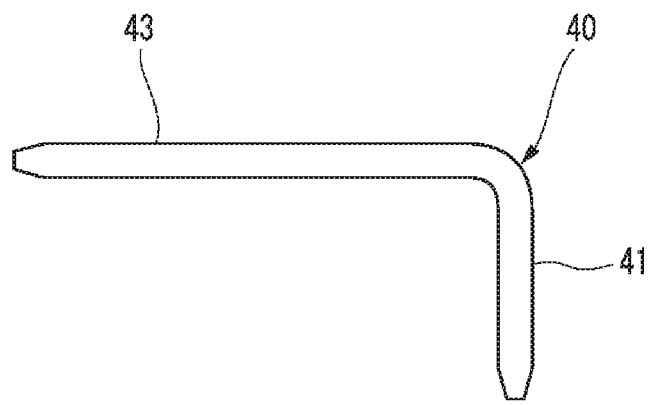
Figure 7C:
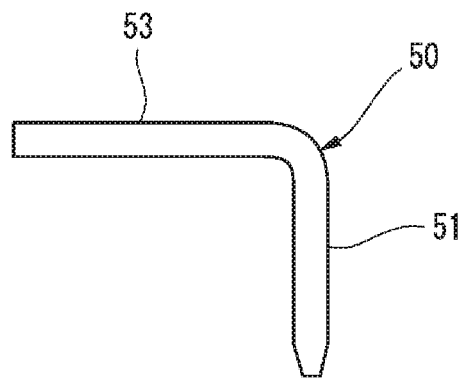
Figure 8A:
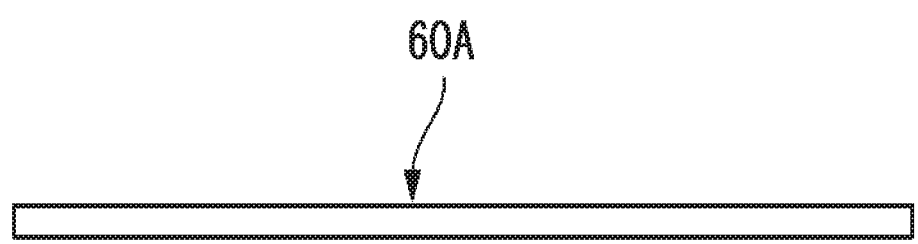
FIGS. 8A and 8B are views showing a manufacturing procedure of the signal terminal, and are respectively side views during manufacturing.
Figure 8B:
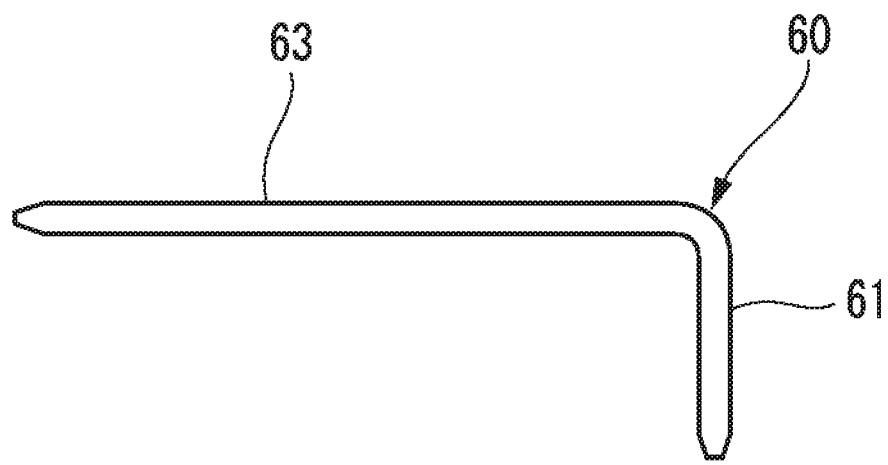
Figure 9A:
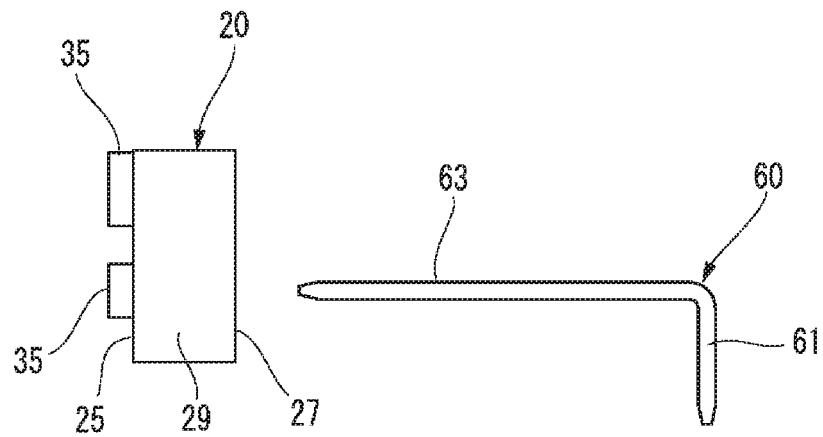
FIGS. 9A to 9C are views showing assembling steps of terminals, and are respectively side views during manufacturing.
Figure 9B:
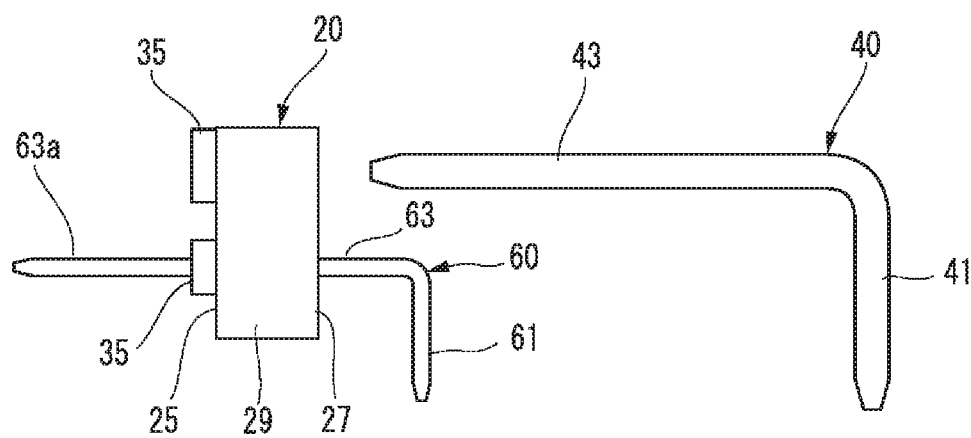
Figure 9C:
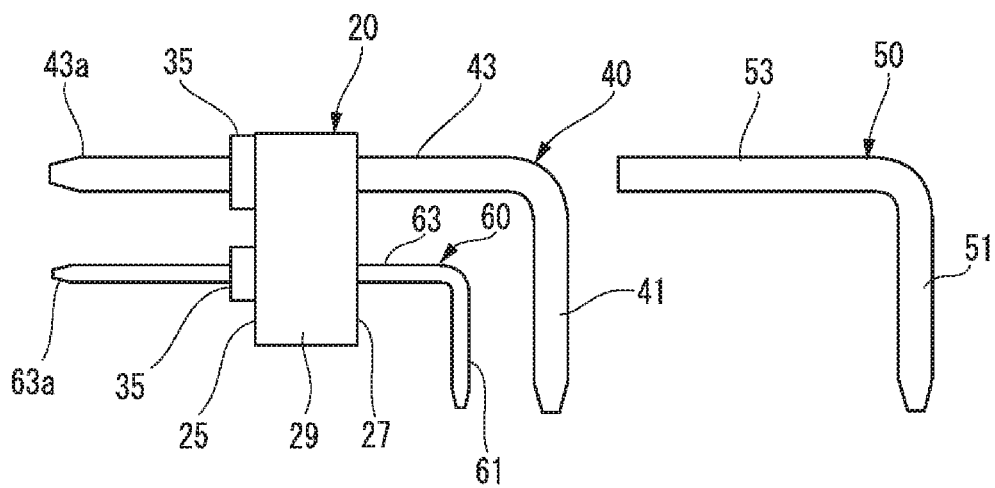

Next, a manufacturing method of the connector 10 according to the present embodiment will be described. FIGS. 7A to 7C are views showing a manufacturing procedure of the power terminal 40 and the antenna terminal 50, and are side views of respective steps during manufacturing. FIGS. 8A and 8B are views showing a manufacturing procedure of the signal terminal 60, and are side views of respective steps during manufacturing. FIGS. 9A to 9C are views showing assembling steps of terminals, and are respectively side views during assembling.

In order to manufacture the power terminal 40, as shown in FIG. 7A, a terminal rod body 40A serving as the power terminal 40 is formed. The terminal rod body 40A may be formed by cutting an elongated wire rod, or may be formed by punching a metal plate. Next, as shown in FIG. 7B, the terminal rod body 40A is bent into an L-shape, and is processed into the power terminal 40 having the leg portion 41 and the connection portion 43.

The antenna terminal 50 is manufactured by processing the power terminal 40. Specifically, as shown in FIG. 7C, the connection portion 43 of the power terminal 40 is cut to remove a portion serving as the connection end portion 43a.

In order to manufacture the signal terminal 60, as shown in FIG. 8A, a terminal rod body 60A serving as the signal terminal 60 is formed. The terminal rod body 60A may be formed by cutting an elongated wire rod, or may be formed by punching a metal plate. Next, as shown in FIG. 8B, the terminal rod body 60A is bent into an L-shape, and is processed into the signal terminal 60 having the leg portion 61 and the connection portion 63.

First, the signal terminal 60 is mounted to the housing 20. Specifically, as shown in FIG. 9A, the connection portion 63 of the signal terminal 60 is inserted and pressed in a fitted manner into the signal terminal insertion hole 33 from a side of the rear surface 27 of the housing 20 with the leg portion 61 extending downward. Then, as shown in FIG. 9B, the connection portion 63 of the signal terminal 60 protrudes from the terminal block 35 on the front surface 25 of the housing 20 by the specified length L. Thereby, the connection portion 63 of the signal terminal 60 has a portion protruding in an exposed manner from the terminal block 35 on the front surface 25 of the housing 20 as the connection end portion 63a.

Next, the power terminal 40 is attached to the housing 20. Specifically, as shown in FIG. 9B, the connection portion 43 of the power terminal 40 is inserted and pressed in a fitted manner into the power terminal insertion hole 31 from the side of the rear surface 27 of the housing 20 with the leg portion 41 extending downward. Then, as shown in FIG. 9C, the connection portion 43 of the power terminal 40 protrudes in an exposed manner from the terminal block 35 on the front surface 25 of the housing 20 by the specified length L. Thereby, the connection portion 43 of the power terminal 40 has a portion protruding from the terminal block 35 on the front surface 25 of the housing 20 as the connection end portion 43a.

Thereafter, the antenna terminal 50 is attached to the housing 20. Specifically, as shown in FIG. 9C, the connection portion 53 of the antenna terminal 50 is inserted and pressed in a fitted manner into the power terminal insertion hole 31 from the side of the rear surface 27 of the housing 20 with the leg portion 51 extending downward. At this time, the connection portion 53 is inserted into the power terminal insertion hole 31 such that an end surface of the connection portion 53 of the antenna terminal 50 is flush with the end surface of the terminal block 35 on the front surface 25 of the housing 20.

Through the above steps, the connector 10 having a function of an antenna for wireless communication can be easily manufactured. The order of attaching the power terminal 40, the antenna terminal 50 and the signal terminal 60 to the housing 20 is not limited to the above example. The end surface of the connection portion 53 of the antenna terminal 50 may be disposed at a position slightly protruding from, or may be disposed at a position slightly retracted from, the end surface of the terminal block 35 on the front surface 25 of the housing 20.

Figure 10A:
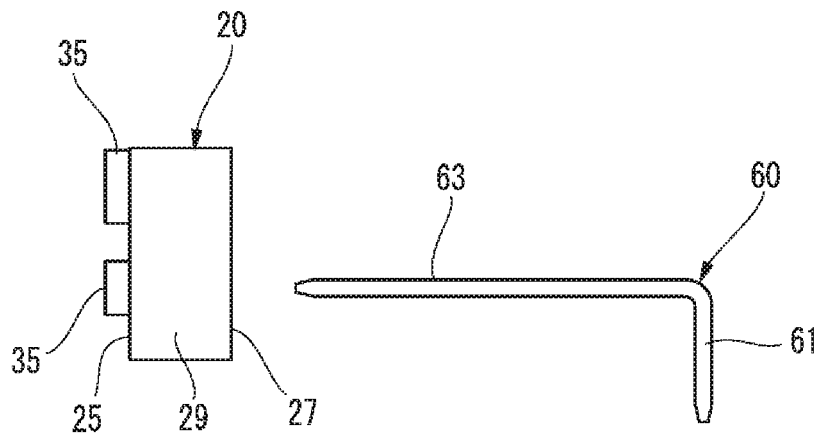
FIGS. 10A to 10C are views showing other assembling steps of the terminals, and are respectively side views during manufacturing.
Figure 10B:
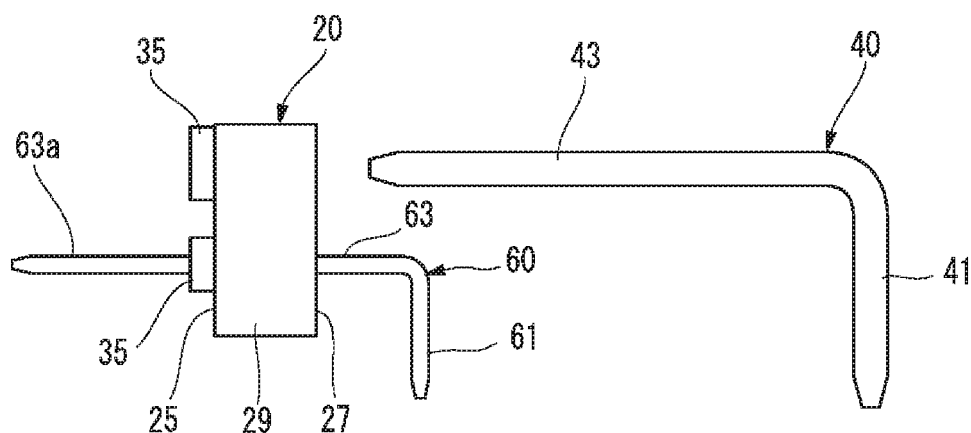
Figure 10C:
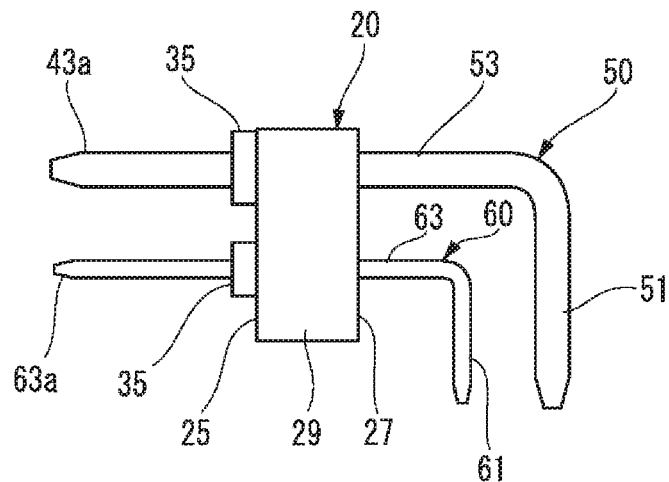

Next, another manufacturing method of the connector 10 will be described. FIGS. 10A to 10C are views showing other assembling steps of the terminals, and are respectively side views during assembling.

The terminal rod body 40A is manufactured, and the terminal rod body 40A is bent into an L-shape to be processed into the power terminal 40 having the leg portion 41 and the connection portion 43 (see FIGS. 7A and 7B). At this time, the power terminal 40 that will be processed to be the antenna terminal 50 in a later step is also manufactured. Further, the terminal rod body 60A is manufactured, and the terminal rod body 60A is bent into an L-shape to be processed into the signal terminal 60 having the leg portion 61 and the connection portion 63 (see FIGS. 8A and 8B).

As shown in FIG. 10A, the connection portion 63 of the signal terminal 60 is inserted and pressed in a fitted manner into the signal terminal insertion hole 33 from the side of the rear surface 27 of the housing 20 with the leg portion 61 extending downward. Then, as shown in FIG. 10B, the connection portion 63 of the signal terminal 60 protrudes from the terminal block 35 on the front surface 25 of the housing 20 by the specified length L, and the portion protruding from the terminal block 35 serves as the connection end portion 63a.

Next, the connection portion 43 of the power terminal 40 is inserted and pressed in a fitted manner into the power terminal insertion hole 31 from the side of the rear surface 27 of the housing 20 with the leg portion 41 extending downward. Then, as shown in FIG. 10C, the connection portion 43 of the power terminal 40 protrudes from the terminal block 35 on the front surface 25 of the housing 20 by the specified length L, and the portion protruding from the terminal block 35 serves as the connection end portion 43*a*.

Thereafter, any one of the power terminals 40 attached to the housing 20 serves as the antenna terminal 50. Specifically, in the power terminal 40 serving as the antenna terminal 50, the connection portion 43 protruding from the terminal block 35 on the front surface 25 of the housing 20 is cut at the end surface of the terminal block 35. Then, a part of the power terminal 40 serving as the connection end portion 43*a* of the connection portion 43 is removed to form the antenna terminal 50.

Through the above steps, the connector 10 having a function of an antenna for wireless communication can be easily manufactured. The order of attaching the power terminal 40 and the signal terminal 60 to the housing 20 is not limited to the above example.

As described above, according to the manufacturing method of the connector 10 of the present embodiment, the manufactured common power terminals 40 are attached to the housing 20, and a tip end portion of the connection portion 43 of at least one of the power terminals 40 is to be cut to form the antenna terminal 50. Therefore, by using the manufactured common terminals, the manufacturing cost can be reduced by using a common mold for processing the terminals, for example. In the connector 10 manufactured by this manufacturing method, the structure can be simplified and the assembling work can be improved as compared with a case where a separately manufactured antenna is provided. Furthermore, since the connection portion 53 of the antenna terminal 50 is shorter than the connection portion 43 of other power terminals 40, an increase in the strength of the transmitted radio wave by connecting an electric wire of an external device to another free power terminal 40 can be prevented.

For example, in the above embodiment, the antenna terminal 50 is formed by removing a part of the connection portion 43 of the power terminal 40, but the terminal as a base of the antenna terminal 50 is not limited to the power terminal 40.

According to an aspect of the embodiments described above, a connector (10) is configured to be mounted on a printed circuit board (1) and to be connected to a mating connector. The connector (10) includes a housing (20) configured to be fixed to the printed circuit board (1), the housing (20) including a plurality of terminal insertion holes (power terminal insertion holes 31) extending parallel to the printed circuit board (1) and parallel to each other; and a plurality of terminals (power terminals 40), each of the plurality of terminals (power terminals 40) including a connection portion (43) and a leg portion (41) forming an L-shape together with the connection portion, the connection portion (43) being inserted into one of the terminal insertion holes (the power terminal insertion hole 31) toward the mating connector such that the connection portion (43) is supported by the housing (20) and such that the leg portion (41) is electrically connectable to the printed circuit board (1). The plurality of terminals (the power terminals 40) includes a first terminal (40) configured to be connected to the mating connector, and a second terminal (50) configured to serve as an antenna. The connection portion (53) of the second terminal (50) is shorter than the connection portion (43) of the first terminal (power terminal 40).

According to the connector configured as above, at least one of the plurality of terminals whose connection portions are to be inserted into the terminal insertion holes of the housing serves as the antenna terminal whose connection portion has a shortened length. Wireless communication can be performed using the antenna terminal as an antenna. Therefore, even though the connector includes an antenna with which wireless communication can be established, the structure of the connector itself can be simplified and furthermore the assembling work can be improved as compared with a case where a separately manufactured antenna is provided. In addition to this, since the length of the connection portion of the antenna terminal is shorter than those of other terminals, an increase in the strength of the transmitted radio wave, which can be caused by connecting an electric wire of an external device or the like to the terminal, can be prevented. That is, the structure can be simplified and the assembling work can be improved while complying with the laws and regulations regarding radio waves.

The connection portion (43) of the first terminal (40) may include a connection end portion (43*a*) extending from a connection surface (a front surface 25) of the housing (20), the connection surface (a front surface 25) being configured to face toward the mating connector. The second terminal (50) may be supported by the housing (20) without the connection portion (53) of the second terminal (50) extending beyond the connection surface (a front surface 25).

According to the connector configured as above, since the antenna terminal differs from other terminals only in that no connection end portion extending beyond the connection surface with the mating connector is provided, the antenna terminal can be easily manufactured out of other terminals. Thereby, the versatility of manufacturing can be improved and the manufacturing cost can be reduced. In addition to this, since no connection terminal portion extending in an exposed manner to the connection side with the mating connector is provided, a terminal of the mating connector will not be erroneously connected to the antenna terminal.

The connection portion (43, 53) of any of the terminals (the power terminals 40) including the second terminal (50) may be insertable into any of the terminal insertion holes (the power terminal insertion hole 31) of the housing (20).

With this configuration, the versatility of assembling can be improved by using common terminal insertion holes.

An end surface of the connection portion (53) of the second terminal (50) may be flush with the connection surface (a front surface 25) of the housing (20).

Alternatively, the second terminal (50) may be supported by the housing (20) such that the connection portion (53) of the second terminal (50) protrudes from the connection surface (a front surface 25) of the housing (20).

According to another aspect of the embodiments described above, a connector manufacturing method includes forming a plurality of terminals (power terminals 40), each of the plurality of terminals (power terminals 40) comprising a connection portion (43) and a leg portion (41) by bending a rod element made of an electrically conductive metal material, inserting the connection portions (43) of the plurality of terminals (power terminals 40) into terminal insertion holes (power terminal insertion holes 31) of a housing (20) toward a first direction, the terminal insertion holes (power terminal insertion holes 31) being parallel to each other, with the leg portions (41) extending in a second direction and cutting at least one of the connection portions (43) of the terminals (power terminals 40) to shorten the at least one of the connection portions (43) to form an antenna terminal (50). The inserting may include inserting parts of the connection portions (43) through the terminal insertion holes (power terminal insertion holes 31) to extend out of the housing (20) and the cutting may include cutting at least one of the parts of the connection portions (43) extended out of the housing (20). The cutting may be performed before the inserting.

According to the connector manufacturing method described as above, the terminals can be alternately used as a terminal or an antenna terminal. The terminals are attached to the housing, and the tip end of the connection portion of at least one of the terminals is cut to form the antenna terminal. Therefore, by using the terminals that can be used as a terminal or an antenna terminal, the manufacturing cost can be reduced using a common mold for processing the terminals, for example. Furthermore, in the connector manufactured by this manufacturing method, the structure can be simplified and the assembling work can be improved as compared with a case where a separately manufactured antenna is provided. In addition, since a length of the connection portion of the antenna terminal is shorter than those of other terminals, an unnecessary increase in the strength of the radio wave transmitted from the antenna can be prevented, which might occur, for example by connecting the antenna to an electric wire of an external device.

While the present invention has been described with reference to certain exemplary embodiments thereof, the scope of the present invention is not limited to the exemplary embodiments described above, and it will be understood by those skilled in the art that various changes and modifications may be made therein without departing from the scope of the present invention as defined by the appended claims.

What is claimed is:

1. A connector configured to be mounted on a printed circuit board and to be connected to a mating connector, the connector comprising:
    a housing configured to be fixed to the printed circuit board, the housing comprising a plurality of terminal insertion holes extending parallel to the printed circuit board and parallel to each other; and
    a plurality of terminals, each of the plurality of terminals comprising a connection portion and a leg portion forming an L-shape together with the connection portion, the connection portion being inserted into one of the terminal insertion holes toward the mating connector such that the connection portion is supported by the housing and such that the leg portion is electrically connectable to the printed circuit board,
    wherein the plurality of terminals comprises a first terminal configured to be connected to the mating connector, and a second terminal configured to serve as an antenna,
    wherein the connection portion of the second terminal is shorter than the connection portion of the first terminal,
    wherein the housing includes a connection surface that is configured to face toward the mating connector,
    wherein the connection portion of the first terminal comprises a connection end portion extending from the connection surface of the housing, and
    wherein an end surface of the connection portion of the second terminal is flush with the connection surface of the housing.

2. The connector according to claim 1,
    wherein the connection portion of any of the terminals including the second terminal is insertable into any of the terminal insertion holes of the housing.

3. A connector manufacturing method comprising:
    forming a plurality of terminals, each of the plurality of terminals comprising a connection portion and a leg portion by bending a rod element made of an electrically conductive metal material;
    inserting the connection portions of the plurality of terminals into terminal insertion holes of a housing toward a first direction, the terminal insertion holes being parallel to each other, with the leg portions extending in a second direction; and
    cutting at least one of the connection portions of the terminals to shorten the at least one of the connection portions to form an antenna terminal.

4. The connector manufacturing method according to claim 3,
    wherein the inserting comprises inserting parts of the connection portions through the terminal insertion holes to extend out of the housing, and
    wherein the cutting comprises cutting at least one of the parts of the connection portions extended out of the housing.

5. The connector manufacturing method according to claim 3,
    wherein the cutting is performed before the inserting.

6. A connector configured to be mounted on a printed circuit board and to be connected to a mating connector, the connector comprising:
    a housing configured to be fixed to the printed circuit board, the housing comprising a plurality of terminal insertion holes extending parallel to the printed circuit board and parallel to each other; and
    a plurality of terminals, each of the plurality of terminals comprising a connection portion and a leg portion forming an L-shape together with the connection portion, the connection portion being inserted into one of the terminal insertion holes toward the mating connector such that the connection portion is supported by the housing and such that the leg portion is electrically connectable to the printed circuit board,
    wherein the plurality of terminals comprises a first terminal configured to be connected to the mating connector, and a second terminal configured to serve as an antenna,
    wherein the connection portion of the second terminal is shorter than the connection portion of the first terminal,
    wherein the connection portion of the first terminal comprises a connection end portion extending from a connection surface of the housing, the connection surface being configured to face toward the mating connector,
    wherein the second terminal is supported by the housing without the connection portion of the second terminal extending beyond the connection surface, and
    wherein an end surface of the connection portion of the second terminal is retracted from the connection surface of the housing.

* * * * *